US009530501B2

(12) United States Patent
Pelley et al.

(10) Patent No.: US 9,530,501 B2
(45) Date of Patent: Dec. 27, 2016

(54) NON-VOLATILE STATIC RANDOM ACCESS MEMORY (NVSRAM) HAVING A SHARED PORT

(71) Applicant: FREESCALE SEMICONDUCTOR, INC., Austin, TX (US)

(72) Inventors: Perry H. Pelley, Austin, TX (US); Frank K. Baker, Jr., Austin, TX (US); Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 109 days.

(21) Appl. No.: 14/588,177

(22) Filed: Dec. 31, 2014

(65) Prior Publication Data

US 2016/0188457 A1    Jun. 30, 2016

(51) Int. Cl.
| | | |
|---|---|---|
| *G11C 11/00* | (2006.01) | |
| *G11C 16/00* | (2006.01) | |
| *G11C 11/22* | (2006.01) | |
| *G11C 11/24* | (2006.01) | |
| *G11C 7/18* | (2006.01) | |

(52) U.S. Cl.
CPC ............ *G11C 16/00* (2013.01); *G11C 11/22* (2013.01); *G11C 7/18* (2013.01); *G11C 11/24* (2013.01)

(58) Field of Classification Search
CPC ..... G11C 11/22; G11C 16/0483; G11C 16/16; G11C 7/06; G11C 7/18; G11C 2211/4013
USPC ......................................................... 711/103
See application file for complete search history.

(56) References Cited

U.S. PATENT DOCUMENTS

| | | | |
|---|---|---|---|
| 4,809,225 A | | 2/1989 | Dimmler et al. |
| 4,980,859 A | | 12/1990 | Guterman et al. |
| 5,349,302 A | | 9/1994 | Cooper |
| 6,084,799 A | * | 7/2000 | Tanzawa ................ G11C 16/24 365/185.05 |

(Continued)

FOREIGN PATENT DOCUMENTS

| | | |
|---|---|---|
| JP | 60144977 A | 7/1985 |
| JP | 1927276 C | 1/1986 |
| JP | 2002109875 A | 4/2002 |
| JP | 2011081896 A | 4/2011 |
| KR | 20020002823 A | 1/2002 |
| WO | 0051131 A1 | 8/2000 |
| WO | 2006121497 A2 | 11/2006 |

OTHER PUBLICATIONS

Notice of Allowance dated Aug. 3, 2016 in U.S. Appl. No. 14/682,475.
Miyahara, M., et al. "A Low-Noise Self-Calibrating Dynamic Comparator for High-Speed ADCs", IEEE Asian Solid-State Circuits Conference, Nov. 3-5, 2008, pp. 269-272.

(Continued)

*Primary Examiner* — Mardochee Chery (57) ABSTRACT

A nonvolatile memory device includes a shared port block, a plurality of decoded address signals, a read signal, and a read word line. The shared port block includes a shared port communicatively coupled to a block, the block comprising a plurality of memory cells, wherein the shared port is operable to sense a voltage level at each of the plurality of memory cells. The plurality of decoded address signals are communicatively coupled to the block. Each of the plurality of decoded address signals is operable to enable a corresponding one of the plurality of memory cells. The read signal is communicatively coupled to the shared port. The read signal is operable to enable a read operation associated with the block. The read word line signal is communicatively coupled to the shared port block. The read word line signal is operable to enable the read operation.

20 Claims, 6 Drawing Sheets

(56) References Cited

U.S. PATENT DOCUMENTS

| | | | |
|---|---|---|---|
| 6,625,056 | B1 | 9/2003 | Kihara |
| 6,847,568 | B2 | 1/2005 | Gogl et al. |
| 6,980,459 | B2 | 12/2005 | Seshadri et al. |
| 7,079,415 | B2 | 7/2006 | Frey |
| 7,113,437 | B2 | 9/2006 | Schweickert et al. |
| 7,868,663 | B2 | 1/2011 | Oh et al. |
| 8,493,806 | B1 | 7/2013 | Chen |
| 8,638,599 | B2 | 1/2014 | Akiyama |
| 9,202,543 | B2 | 12/2015 | Boujamaa et al. |
| 2005/0122762 | A1* | 6/2005 | Lim .................. G11C 7/06 365/145 |
| 2006/0203550 | A1* | 9/2006 | Lee .................. G11C 16/30 365/185.13 |
| 2011/0216571 | A1 | 9/2011 | Yamazaki et al. |
| 2015/0016183 | A1 | 1/2015 | Sinangil et al. |

OTHER PUBLICATIONS

Choudhary, A., et al. "A Process Variation Tolerant Self-Compensation Sense Amplifier Design", http://scholarworks.umass.edu/cgi/viewcontent.cgi?article=1253%context-theses, University of Massachusetts—Amherst, Masters Theses, Sep. 2008, 107 pages.

Groeneveld, S., et al. "Offset Correction Techniques for Voltage Sense Amplifiers", http://eprints.eemcs.utwente.nl/8798/, University of Twente, Master Thesis, Aug. 2006, 72 pages.

Notice of Allowance dated Nov. 4, 2015 in U.S. Appl. No. 14/572,780.

Non-final office action dated Mar. 29, 2016 in U.S. Appl. No. 14/682,475.

Abe, K., et al., "Novel Hybrid DRAM/MRAM Design for Reducing Power of High Performance Mobile Cpu", IEEE International Electron Devices Meeting (IEDM), pp. 10.5.1-10.5.4, Dec. 10-13, 2012.

U.S. Appl. No. 14/682,475, Pelley, P. et al., "Mismatch-Compensated Sense Amplifier for Highly Scaled Technology", filed Apr. 9, 2015.

U.S. Appl. No. 14/572,780, Pelley, P. et al., "Non-Volatile Memory Using Bi-Directional Resistive Elements and Capacitive Elements", filed Dec. 17, 2014.

* cited by examiner

NON-VOLATILE STATIC RANDOM ACCESS MEMORY (NVSRAM) HAVING A SHARED PORT

BACKGROUND

Field

This disclosure relates generally to non-volatile memories (NVMs), and more particularly to non-volatile static random access memories (NVSRAMs).

Related Art

Non-volatile static random access memories (NVS-RAMs) hold the promise of having the benefits of both non-volatile memories (NVMs) and static random access memories (SRAMs). A type of NVM that is of particular interest is the resistive RAM (RRAM) which has a programmable resistor as the non-volatile element. The accessing for speed of reading and writing is similar to that of SRAMs. One of the difficulties has been obtaining access speeds, especially the speed of reading, comparable to that of SRAMs. The write speed may be slower as well but much, much faster than typical NVMs.

Accordingly there is a need to provide further improvement in achieving an NVSRAM that addresses one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a shared port block has a plurality, for example 8, of bit cells that share a partial sense amplifier and write driver so as to reduce delays in reading as well as writing which is particularly effective for NVSRAMs that use a programmable resistance. This is better understood by reference to the drawings and the following written description.

Figure 1:
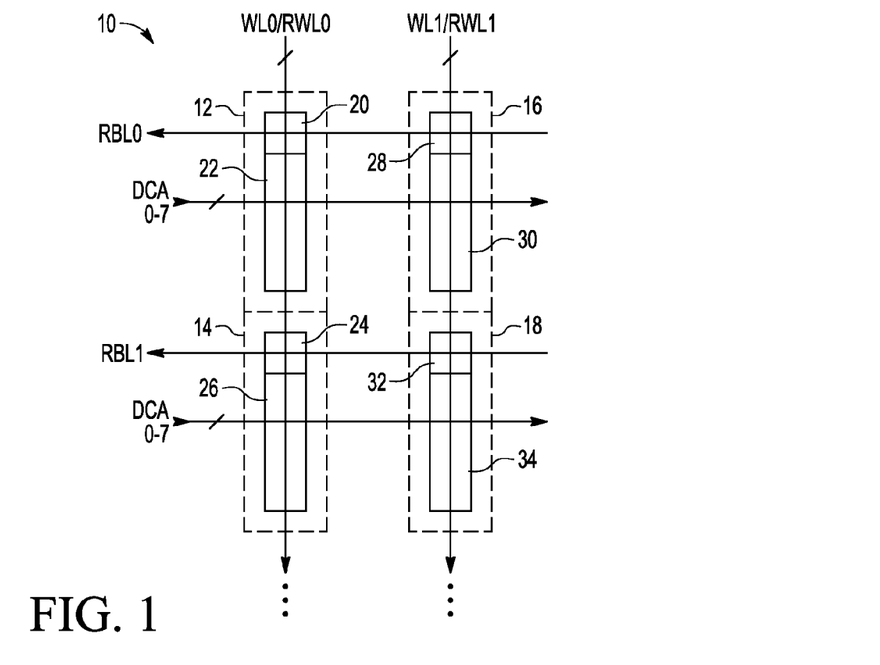
FIG. 1 is a block diagram of an NVSRAM showing elements useful for a read.

Shown in FIG. 1 is a NVSRAM 10 having a shared port block 12, a shared port block 14, a shared port block 16, a shared port block 18, a read bit line RBL0 coupled to shared port blocks 12 and 16, a read bit line RBL1 coupled to share port blocks 14 and 18, decoded column address DCA signal lines 0-7 coupled to shared port blocks 12, 14, 16, and 18, a word line WL0 coupled to shared port blocks 12 and 14, and a word line WL1 coupled to shared port blocks 16 and 18. A variation can be that not all of the shared port blocks on a given word line receive the same DCA signals. Shared port blocks 12, 14, 16, and 18 each have a shared port and a block. Shared port block 12 has a shared port 20 and a block 22. Shared port block 14 has a shared port 24 and a block 26. Shared port block 16 has a shared port 28 and a block 30. Shared port block 18 has a shared port 32 and a block 34. In this example, 8 memory cells are in each of blocks 12, 14, 16, and 18. In a read operation, one of decoded column address signals 0-7 is selected to be active, which may be by a logic "1," and the remainder are maintained at the opposite logic state which may be a logic "0." A word line, such as word line WL0, is enabled, and the remainder of the word lines are kept disabled. A DCA signal, such as DCA signal 0, is selected, and the cells coupled to receive that signal receive an active signal. These cells include those in blocks 22, 26, 30, and 34. A read bit line, such as read bit line RBL0, is selected to receive data. More than one read bit line may be selected to receive data. For the case of both read bit lines RBL0 and RBL1 being selected to receive data, the selected cells in blocks 22 and 26 are coupled to shared ports 20 and 24, respectively, where they are quickly strengthened and coupled to read bit lines RBL0 and RBL1, respectively. This significantly speeds the sensing process compared to simply coupling the selected memory cell to the bit line. The memory elements tend to have relatively high resistance which makes providing a detectable signal on a bit line a significantly slower process than that for an SRAM.

Figure 2:
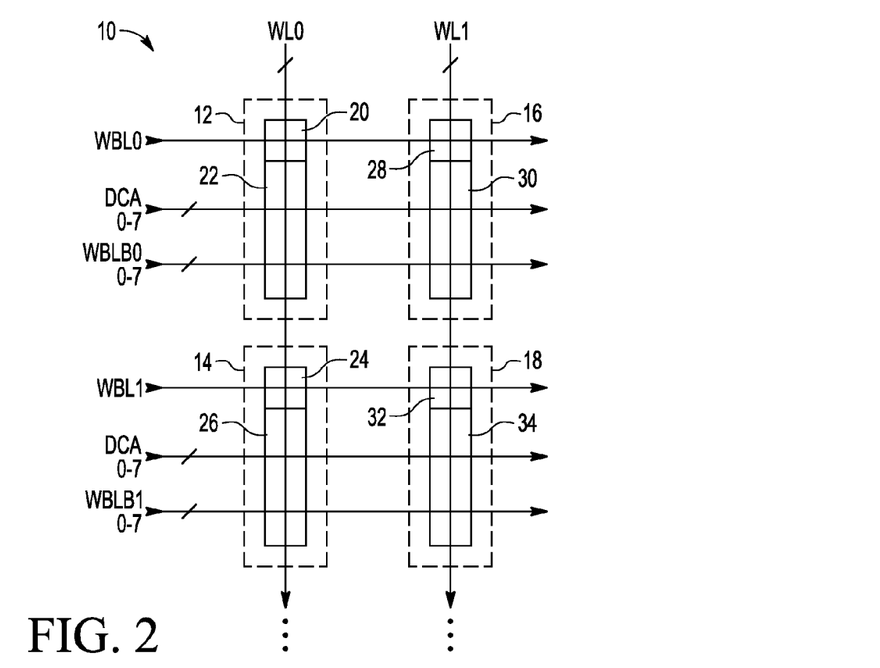
FIG. 2 is a block diagram of the NVSRAM showing elements useful for a write.

Shown in FIG. 2 is NVSRAM 10 further showing a write bit line WBL0 coupled to shared ports 20 and 28, a write bit line WBL1 coupled to shared ports 24 and 32, write bit line bar signals WBLB0 0-7 coupled to blocks 22 and 30, and a write bit line bar signal WBLB1 coupled to blocks 26 and 34. For the case of writing blocks 22 and 26, write bit line signal WBL0 contains data to be written into an NVSRAM cell in block 22 and write bit line WBL1 contains data to be written into an NVSRAM cell in block 26. One of DCA signals 0-7 is active which selects a cell in each of blocks 22 and 26 and is also received by blocks 30 and 34 but does not have the effect of selecting a cell in blocks 30 and 34 because word line WL1 is not selected. One of write bit line bar signals WBLB0 0-7 and one of write bit line bar signals WBLB1 0-7 are provided as the complement to the selected cell as part of the writing. The selection of the write bit line bar signals corresponds to the selection of the DCA signals. Thus if DCA signal 0 is selected then write bit line bar signal WBLB0 0 will be the complement to the data provided by write bit line WBL0. For programming then the selected cell receives both the true and complement of the data to be written.

Figure 3:
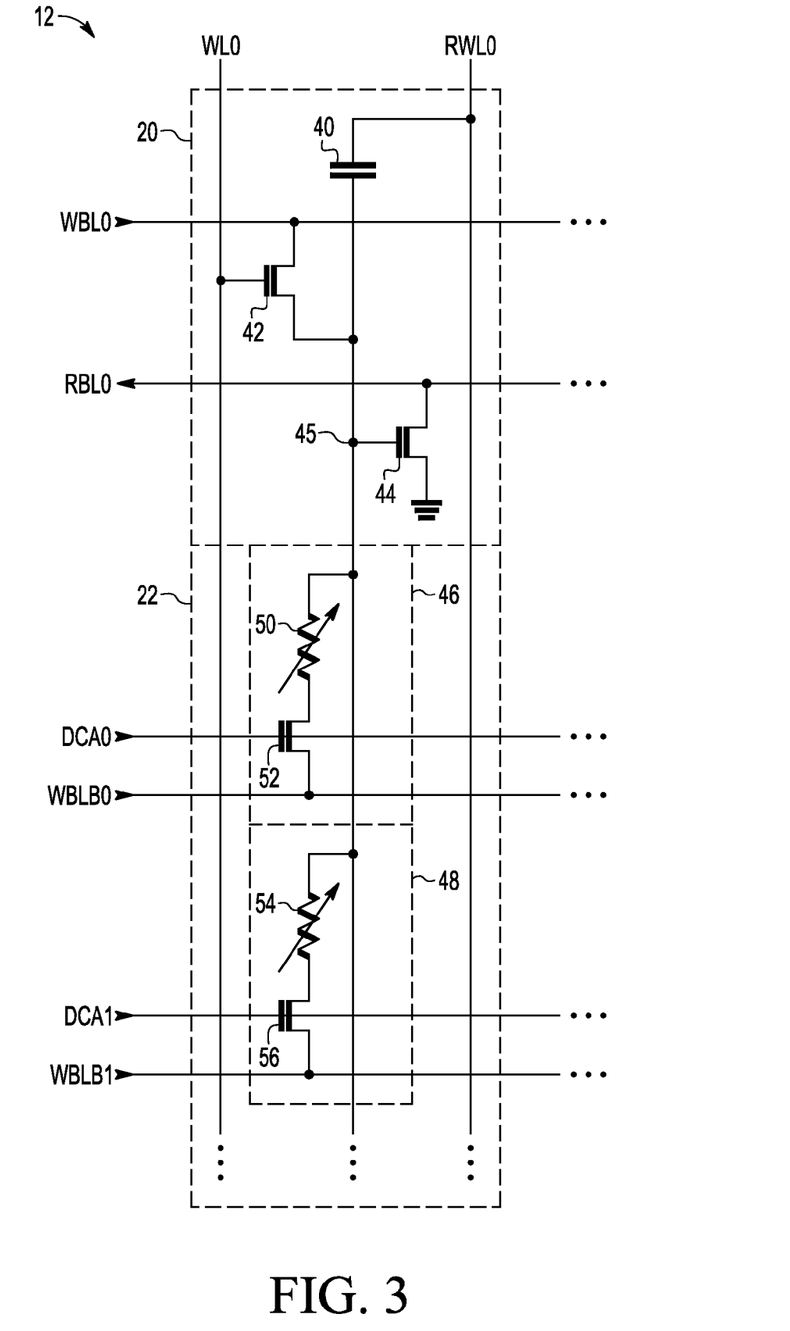
FIG. 3 is a circuit diagram of a portion of the NVSRAM of FIGS. 1 and 2.

Shown in FIG. 3 is a circuit diagram of a portion of shared port block 12 showing shared port 20 and a portion of block 22. Shared port 20 has a capacitor 40 having a first terminal coupled to read word line RWL0 and a second terminal coupled to a node 45; an N channel transistor 42 having a first current electrode coupled to write bit line WBL0, a gate coupled to word line WL0, and a second current electrode coupled to node 45; and an N channel transistor having a control electrode coupled to node 45, a first current electrode coupled to read bit line RBL0, and a second current electrode coupled to a power supply terminal which may be ground. The portion of Block 22 has a NVSRAM cell 46 and an NVSRAM cell 48. NVSRAM cell 46 has a programmable resistor 50 having a first terminal coupled to node 45 and a second terminal. NVSRAM cell 46 further has an N channel transistor 52 having a first current electrode coupled to the second current electrode of programmable resistor 50, a control electrode coupled to decoded column address signal DCA 0, and a second current electrode coupled to write bit line bar WBLB0. NVSRAM cell 48 has a programmable resistor 54 having a first terminal coupled to node 45 and a second terminal. NVSRAM cell 48 further has an N channel transistor 56 having a first current electrode coupled to the second current electrode of programmable resistor 50, a control electrode coupled to decoded column address signal DCA1, and a second current electrode coupled to write bit line bar WBLB1.

Figure 4:
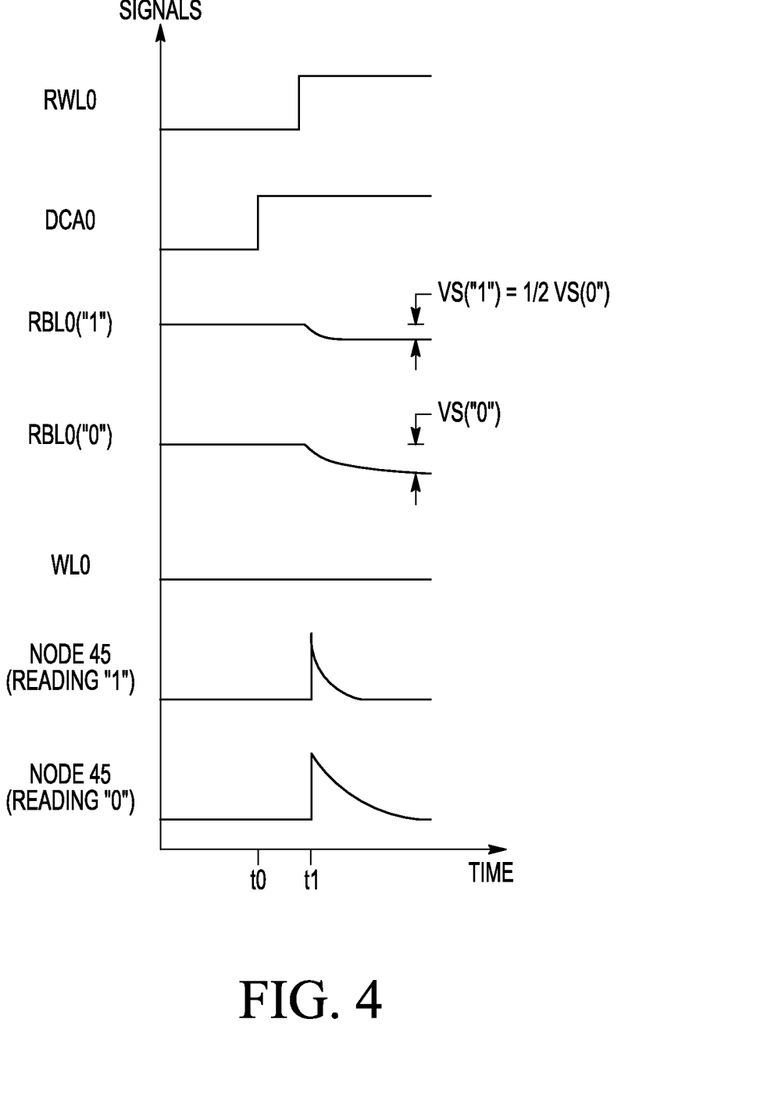
FIG. 4 is a timing diagram for a read operation of the NVSRAM of FIGS. 1 and 2.

Shown in FIG. 4 is a timing diagram for reading an NVSRAM cell such as NVSRAM cell 46. For both case of a writing a "1" and a "0," at a time t0, decoded column address DCA0 switches to a logic high which is followed by read word line RWL0 switching to a logic high. Word line WL0 is held at a logic low during the read which keeps transistor 42 non-conductive. Write bit line WBLB0 is held at a logic low during the read. Read Bit line RBL0 is precharged to a logic high. At time t0, transistor 52 becomes conductive in response to decoded column address DCA0 switching to a logic high which allows for a conductive path through variable resistor 50 between node 45 and write bit line bar WBLB0. With transistor 52 conductive, read word line RWL0 switches to a logic high at time t1 which causes node 45 to immediately rise. For both the case of reading a "1" and a "0," the voltage on node 45 is coupled upward by capacitor 40 but decays more rapidly for the logic "1" case. In this example, logic "1" is the case for programmable resistor 50 being in its more conductive state and a logic "0" for its more resistive state. Alternatively, the convention as to which state is a logic "1" and which is a logic "0" can be switched. Transistor 44 responds by becoming conductive and begins reducing the voltage on read bit line RBL0. A faster decline in voltage of node 45 causes less voltage drop on read bit line RBL0. The faster decline in voltage of node 45 occurs when programmable resistor 50 is in its lower resistive state. The comparative decline is shown in FIG. 4 for node 45 reading a "0" and node 45 reading a "1." Read bit line RBL0 stops dropping sooner for the low resistance state, logic "1," which results in the voltage on read bit line RBL0 being at a higher level when the reduction in voltage has effectively stopped than for the logic "0" case in which transistor 44 continues to reduce the voltage on read bit line RBL0. In this example, the voltage on read bit line RBL0 for the logic "0" case is reduced about twice as much as for the logic "1" case. Transistor 44 can be sized to optimize the gain for achieving a voltage differential between the conductive states that can be quickly and reliably obtained. The use of the amplification provided by transistor 44 is effective in avoiding the slow read access problem of attempting to reduce the voltage on read bit line RBL0 through programmable resistor 50.

For a write of programmable resistor 50, current is flowed in one direction through the programmable resistor for a logic "1" and the opposite direction for a logic "0." The direction choice is achieved by having current be in one direction between write bit line WBL0 and write bit line bar WBLB0 for one state and the opposite direction to achieve the other state while transistor 52 is conductive. The voltage on write bit line WBL0 is coupled to programmable resistor 50 by word line WL0 being a logic high, causing transistor 42 to be conductive. Transistor 52 being conductive can be achieved in the same manner as for the read case. For one case, write bit line WBL0 is provided at a relatively high voltage, such as the positive power supply voltage, VDD, and write bit line bar WBLB is provided at a relatively low voltage such as ground. For the other case, write bit line WBL0 is provided at the relatively low voltage, such as ground, and write bit line bar WBLB is provided at the relatively high voltage such as VDD. The NVSRAM cells not being programmed are prevented from passing current through their programmable resistors by the non-selected decoded column address signals, such as DCA1, causing transistors such as transistors 56 to be non-conductive.

Figure 5:
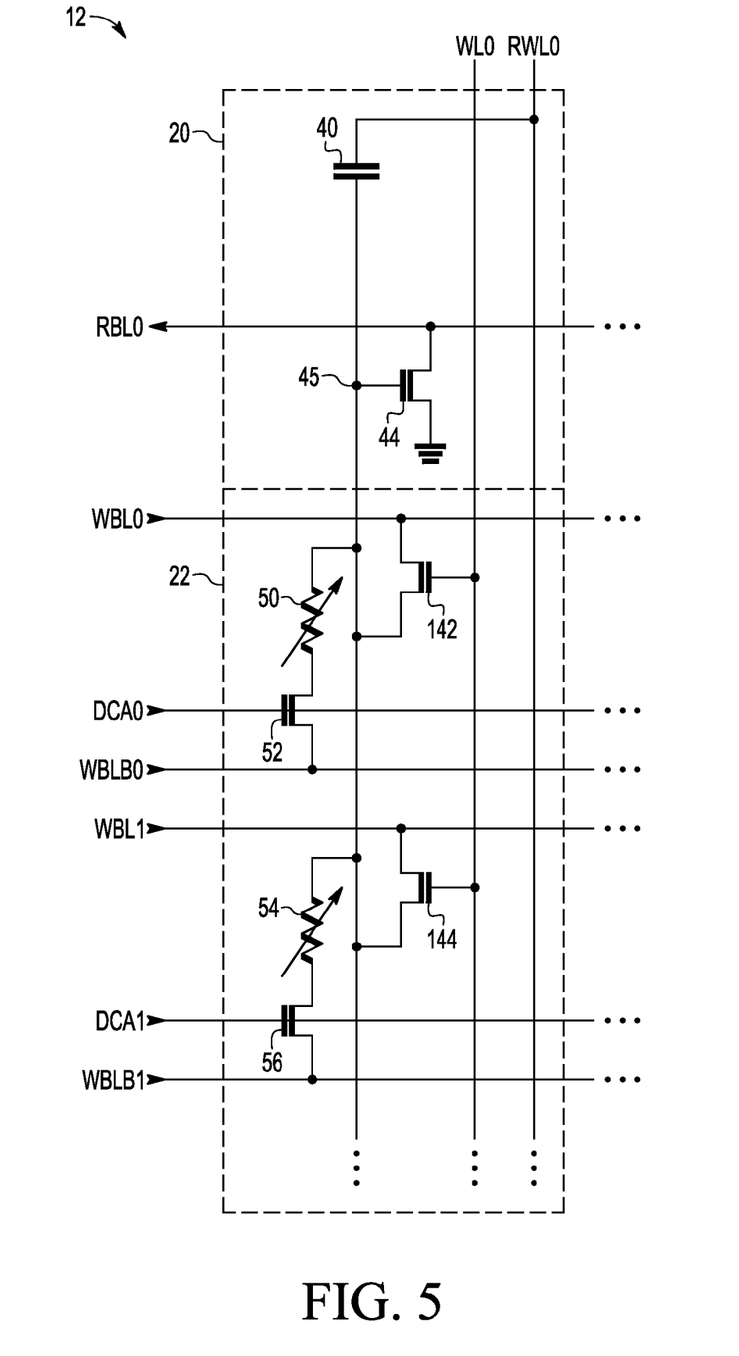
FIG. 5 is a circuit diagram of a portion of the NVSRAM of FIGS. 1 and 2 as an alternative to the portion of the NVSRAM of FIG. 3.

Shown in FIG. 5 is shared port block 12 which is a variation from that of FIG. 3 in which there is a write bit line WBL 0-7 for each NVSRAM cell instead of one shared by all of the NVSRAM cells so that there is a complementary pair of write bit lines for each NVSRAM cell. Thus for each write bit line bar WBLB 0-7 there is a corresponding write bit line WBL 0-7. As shown in FIG. 5, an N channel transistor 142 has a first current electrode coupled to write bit line WBL0, a control electrode coupled to word line WL0, and a second current electrode coupled to node 45. Similarly for the memory cell having programmable resistor 54 and transistor 56, an N channel transistor 144 has a first current electrode coupled to write bit line WBL1, a control electrode coupled to word line WL0, and a second current electrode coupled to node 45. This variation is intended to speed up operation of the write by allowing a plurality of bits in a block to be written in concurrently. In this embodiment both logic "1"'s and logic "0"'s may be written simultaneously.

Figure 6:
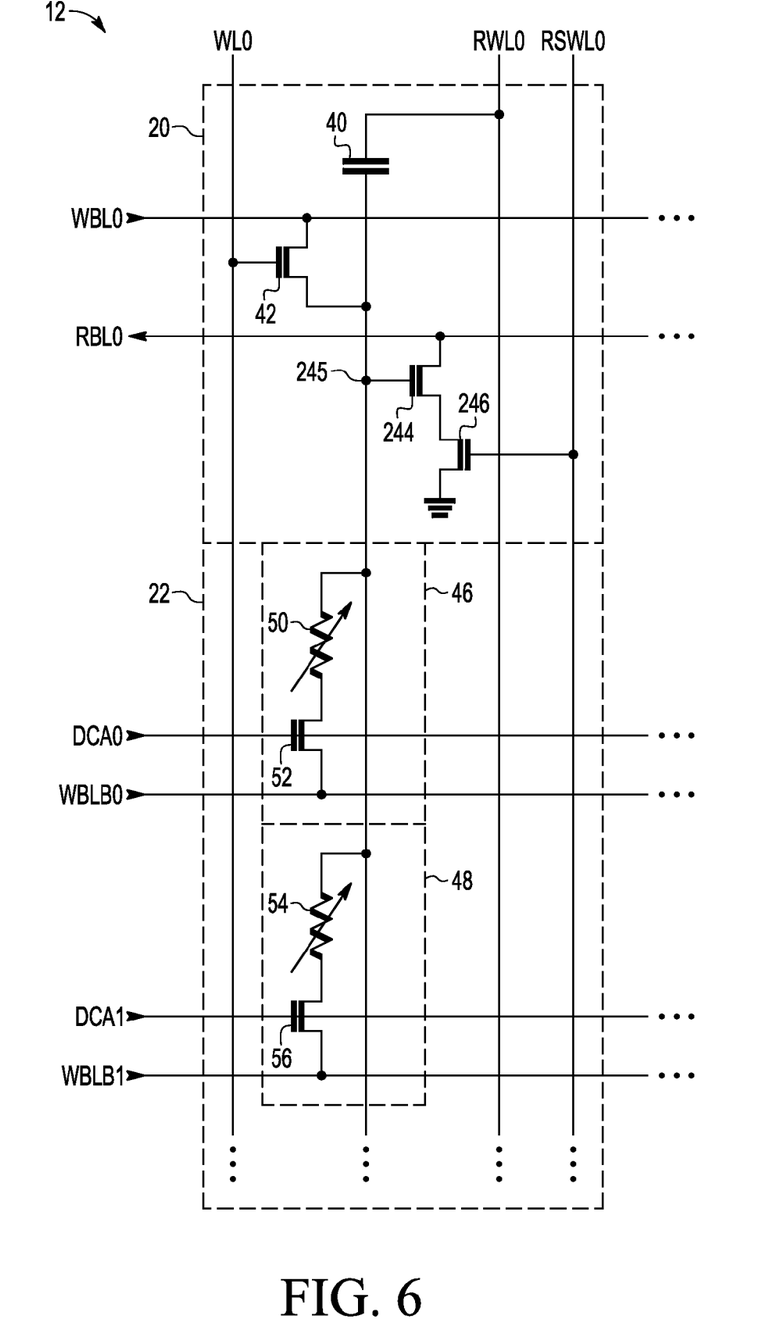
FIG. 6 is a circuit diagram of a portion of the NVSRAM of FIGS. 1 and 2 as a further alternative to the portion of the NVSRAM of FIG. 3.
Figure 7:
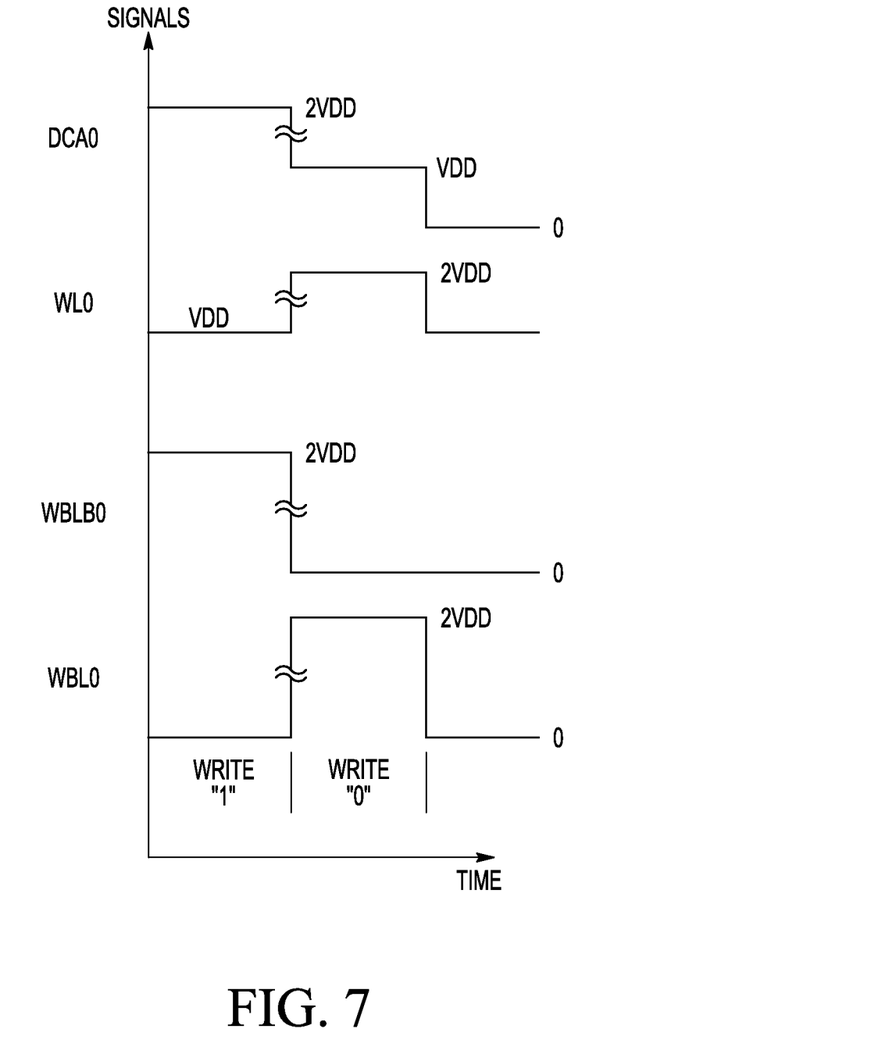
FIG. 7 is a timing diagram of a write operation of the portion of the NVSRAM according to the further alternative of FIG. 6.

Shown in FIG. 6 is shared port block 12 which is a variation from that of FIGS. 3 and 5 with the intent of increasing the programming current by increasing the voltage. Transistor 44 alone would unlikely avoid breakdown so transistor 44 has been replaced by a transistor 244 and a transistor 246 and adding a read line RSWL0 that is active during a read so that transistor 244, during a read, functions in the same manner of transistor 44 during a read. Transistor 246 is intended to share the voltage with transistor 244 during a high voltage write to protect transistor 244 from breakdown. For a high voltage write of a "1," as shown in FIG. 7, 2VDD is applied across NVSRAM cell 46, 2VDD is applied to decoded column address DCA0, VDD is applied to word line WL0, ground is applied to write bit line WBL0, and 2VDD is applied to write bit line bar WBLB0. To reverse the current to write a logic "0," VDD is applied at decoded column address DCA0, 2VDD is applied to word line WL0, 2VDD is applied to write bit line WBL0, and ground is applied to write bit line bar WBLB0. The higher voltage and and resulting higher current have the effect of faster programming. In some technologies it is assumed that there will be transistors with breakdowns lower than the required voltages to achieve a change in logic state. In such a case, the embodiment of FIGS. 6 and 7 would be effective. The voltages of FIG. 7 applied to NVSRAM cell 46 and shared port 20 of FIG. 6 allow programming voltages greater than the breakdown of transistors 42, 50, 244, or 246 while controlling the voltage across each of the individual transistors to be at a lower voltage not exceeding its breakdown voltage.

By now it should be appreciated that there has been provided a nonvolatile memory device having a shared port block comprising a shared port communicatively coupled to a block, the block including a plurality of memory cells, wherein the shared port is operable to sense a voltage level at each of the plurality of memory cells. The nonvolatile memory device further includes a plurality of decoded address signals communicatively coupled to the block, each of the plurality of decoded address signals operable to enable a corresponding one of the plurality of memory cells. The nonvolatile memory device further includes a read signal communicatively coupled to the shared port, the read signal operable to enable a read operation associated with the block. The nonvolatile memory device further includes a read word line signal communicatively coupled to the shared port block, the read word line signal operable to enable the read operation. The nonvolatile memory device may further include a first and second shared port block, each of the first and second shared port blocks communicatively coupled to the plurality of decoded address signals and to the read signal. The nonvolatile memory device may further include a write word line signal communicatively coupled to the shared port block. The nonvolatile memory device may further include a second shared port block comprising a second shared port communicatively coupled to a second block, the second block comprising a second plurality of memory cells, wherein the second shared port is operable to sense a voltage level at each of the second plurality of memory cells, and wherein the second block is communicatively coupled to the plurality of decoded address signals and a second read signal communicatively coupled to the second shared port, the second read signal operable to enable a read operation associated with the second block, and wherein the second shared port block is communicatively coupled to the read word line signal. The nonvolatile memory device may further include a first word line signal communicatively coupled to the first shared port block and a second write word line signal communicatively coupled to the second shared port block. The nonvolatile memory device may have a further characterization by which the shared port block includes a capacitor having a first terminal coupled to the read word line signal and a second terminal coupled to the block, a first transistor having a first current electrode coupled to the second terminal of the capacitor, and having a control electrode coupled to a word line signal, and a second transistor having a first current electrode coupled to the read signal, and having a control electrode coupled to the first current electrode of the first transistor. The nonvolatile memory device may have a further characterization by which each of the plurality of memory cells includes a transistor having a control electrode coupled to a corresponding one of the plurality of decoded address signal and a variable resistance element having a first terminal coupled to a first current electrode of the transistor and having a second terminal coupled to the shared port. The nonvolatile memory device may have a further characterization by which the transistor of each of the plurality of memory cells further comprises a second current electrode coupled to a write bit line. The nonvolatile memory device may have a further characterization by which the shared port block includes a capacitor having a first terminal coupled to the read word line signal and a second terminal coupled to the block and a transistor having a first current electrode coupled to the read signal, and having a control electrode coupled to the second terminal of the capacitor. The nonvolatile memory device may have a further characterization by which each of the plurality of memory cells includes a first transistor having a control electrode coupled to a corresponding one of the plurality of decoded address signals, a variable resistance element having a first terminal coupled to a first current electrode of the first transistor and having a second terminal coupled to the shared port, and a second transistor having a control electrode coupled to a word line signal, and having a first current electrode coupled to the second terminal of the variable resistance element. The nonvolatile memory device may have a further characterization by which the first transistor of each of the plurality of memory cells further comprises a second current electrode coupled to a write bit line and the second transistor of each of the plurality of memory cells further comprises a second current electrode coupled to the write bit line. The nonvolatile memory device may have a further characterization by which the block includes eight memory cells.

Also disclosed is a nonvolatile memory device having a first, second, third, and fourth shared port block, each comprising a shared port communicatively coupled to a block, the block comprising a plurality of memory cells, wherein the shared port is operable to sense a voltage level at each of the plurality of memory cells. The nonvolatile memory device further includes a plurality of decoded address signals communicatively coupled to each block, each of the plurality of decoded address signals operable to enable a corresponding one of the plurality of memory cells. The nonvolatile memory device further includes a first read signal communicatively coupled to the first and second shared ports, the first read signal operable to enable a read operation associated with the first and second blocks. The nonvolatile memory device further includes a second read signal communicatively coupled to the third and fourth shared ports, the second read signal operable to enable a read operation associated with the third and fourth blocks. The nonvolatile memory device further includes a first read word line signal communicatively coupled to the first and third shared ports, the first read word line signal operable to enable the read operation associated with the first and third blocks. The nonvolatile memory device further includes a second read word line signal communicatively coupled to the second and fourth shared ports, the second read word line signal operable to enable the read operation associated with the second and fourth blocks. The nonvolatile memory device may further include a first write word line signal communicatively coupled to the first and third shared port blocks and a second write word line signal communicatively coupled to the second and fourth shared port blocks. The nonvolatile memory device may have a further characterization by which the first shared port block includes a capacitor having a first terminal coupled to the first read word line signal and a second terminal coupled to the block, a first transistor having a first current electrode coupled to the second terminal of the capacitor, and having a control electrode coupled to the first write word line signal, and a second transistor having a first current electrode coupled to the first read signal, and having a control electrode coupled to the first current electrode of the first transistor. The nonvolatile memory device may have a further characterization by which each of the plurality of memory cells includes a transistor having a control electrode coupled to a corresponding one of the decoded address signals, and having a first current electrode coupled to a write bit line and a variable resistance element having a first terminal coupled to a second current electrode of the transistor and having a second terminal coupled to the shared port. The nonvolatile memory device may have a further characterization by which each shared port block includes a capacitor having a first terminal coupled to the first read word line signal and a second terminal coupled to the block and a transistor having a first current electrode coupled to the first read signal, and having a control electrode coupled to the second terminal of the capacitor. The nonvolatile memory device may have a further characterization by which each of the plurality of memory cells includes a first transistor having a control electrode coupled to a corresponding one of the plurality of decoded address signals, and having a first current electrode coupled to a write bit line, a variable resistance element having a first terminal coupled to a second current electrode of the transistor and having a second terminal coupled to the shared port, and a second transistor having a control electrode coupled to the word line signal, and having a first current electrode coupled to the second terminal of the variable resistance element, and having a second current electrode coupled to the write bit line. The nonvolatile memory device may further include a read line coupled to the first shared port block, a capacitor having a first terminal that receives the first read word line signal and a second terminal, a first transistor having a first current electrode that receives the first read signal, a control electrode coupled to the second terminal of the capacitor, and a second current electrode, and a second transistor having a first current electrode coupled to the second current electrode of the first transistor, a control electrode coupled to the read line, and a second current electrode coupled to a power supply terminal.

Disclosed also is a method for performing a read operation on a nonvolatile memory device. The method includes receiving a read signal at a shared port block, the read signal operable to enable a read operation associated with the shared port block, the shared port block comprising a shared port communicatively coupled to a block, the block comprising a plurality of memory cells. The method further includes receiving a plurality of decoded address signals at the shared port block, each of the plurality of decoded address signals operable to enable a corresponding one of the plurality of memory cells. The method further includes receiving a read word line signal at the shared port block, the read word line signal operable to enable the read operation, wherein the shared port includes a capacitor having a first terminal coupled to the read word line signal and a first transistor having a control electrode coupled to a second terminal of the capacitor, and having a current electrode coupled to the read signal.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A nonvolatile memory device comprising:
    a shared port block comprising:
        a block comprising a plurality of memory cells;
        a shared port communicatively coupled to the block, the shared port comprising:
            a capacitor having a first terminal coupled to the plurality of memory cells; and
            a first transistor having a first current electrode coupled to a read bit line, a control electrode coupled to the first terminal of the capacitor, and second current electrode coupled to a power supply terminal;
        wherein the shared port is operable to sense a voltage level at each of the plurality of memory cells;
    a plurality of decoded address signals communicatively coupled to the block, each of the plurality of decoded address signals operable to enable a corresponding one of the plurality of memory cells;
    a read signal communicatively coupled to the shared port, the read signal operable to enable a read operation associated with the block; and
    a read word line signal communicatively coupled to a second terminal of the capacitor of the shared port, the read word line signal operable to enable the read operation.

2. The nonvolatile memory device of claim 1, further comprising a first and second shared port block, each of the first and second shared port blocks communicatively coupled to the plurality of decoded address signals and to the read signal.

3. The nonvolatile memory device of claim 1, further comprising a write word line signal communicatively coupled to the shared port block.

4. The nonvolatile memory device of claim 3, further comprising:
    a second shared port block comprising a second shared port communicatively coupled to a second block, the second block comprising a second plurality of memory cells, wherein the second shared port is operable to sense a voltage level at each of the second plurality of memory cells, and wherein the second block is communicatively coupled to the plurality of decoded address signals; and
    a second read signal communicatively coupled to the second shared port, the second read signal operable to enable a read operation associated with the second block, and wherein the second shared port block is communicatively coupled to the read word line signal.

5. The nonvolatile memory device of claim 2, further comprising a first write word line signal communicatively coupled to the first shared port block and a second write word line signal communicatively coupled to the second shared port block.

6. The nonvolatile memory device of claim 3, wherein the shared port block further comprises:
    a second transistor having a first current electrode coupled to the first terminal of the capacitor, a second current electrode couple to a write bit line, and a control electrode coupled to receive the write word line signal; and
    a third transistor coupled between the first transistor and the power supply terminal, the third transistor having a first current electrode coupled to the second current electrode of the first transistor, a control electrode coupled to receive the read signal, and a second current electrode coupled to the power supply terminal.

7. The nonvolatile memory device of claim 6, wherein each of the plurality of memory cells comprises:
   a transistor having a control electrode coupled to a corresponding one of the plurality of decoded address signal; and
   a variable resistance element having a first terminal coupled to a first current electrode of the transistor and having a second terminal coupled to the shared port.

8. The nonvolatile memory device of claim 7, wherein the transistor of each of the plurality of memory cells further comprises a second current electrode coupled to a write bit line.

9. The nonvolatile memory device of claim 3, wherein the shared port block further comprises:
   a fourth transistor having a first current electrode coupled to a write bit line, a second current electrode coupled to the first terminal of the capacitor, and a control electrode coupled to receive the write word line signal.

10. The nonvolatile memory device of claim 9, wherein each of the plurality of memory cells comprises:
    a first transistor having a control electrode coupled to a corresponding one of the plurality of decoded address signals;
    a variable resistance element having a first terminal coupled to a first current electrode of the first transistor and having a second terminal coupled to the shared port; and
    a second transistor having a control electrode coupled to a word line signal, and having a first current electrode coupled to the second terminal of the variable resistance element.

11. The nonvolatile memory device of claim 10, wherein:
    the first transistor of each of the plurality of memory cells further comprises a second current electrode coupled to a write bit line; and
    the second transistor of each of the plurality of memory cells further comprises a second current electrode coupled to the write bit line.

12. The nonvolatile memory device of claim 1, wherein the block comprises eight memory cells.

13. A nonvolatile memory device comprising:
    a first, second, third, and fourth shared port block, each comprising:
      a block comprising a plurality of memory cells;
      a shared port communicatively coupled to the block, the shared port comprising:
        a capacitor having a first terminal coupled to the plurality of memory cells; and
        a first transistor having a first current electrode coupled to a read bit line, a control electrode coupled to the first terminal of the capacitor, and second current electrode coupled to a power supply terminal;
      wherein the shared port is operable to sense a voltage level at each of the plurality of memory cells;
    a plurality of decoded address signals communicatively coupled to each block, each of the plurality of decoded address signals operable to enable a corresponding one of the plurality of memory cells;
    a first read signal communicatively coupled to the first and second shared ports, the first read signal operable to enable a read operation associated with the first and second blocks;
    a second read signal communicatively coupled to the third and fourth shared ports, the second read signal operable to enable a read operation associated with the third and fourth blocks;
    a first read word line signal communicatively coupled to a second terminal of the capacitor of each of the first and third shared ports, the first read word line signal operable to enable the read operation associated with the first and third blocks; and
    a second read word line signal communicatively coupled to a second terminal of the capacitor of each of the second and fourth shared ports, the second read word line signal operable to enable the read operation associated with the second and fourth blocks.

14. The nonvolatile memory device of claim 13, further comprising:
    a first write word line signal communicatively coupled to the first and third shared port blocks; and
    a second write word line signal communicatively coupled to the second and fourth shared port blocks.

15. The nonvolatile memory device of claim 14, wherein the first shared port block further comprises:
    a second transistor having a first current electrode coupled to the first terminal of the capacitor, a second current electrode couple to a write bit line, and a control electrode coupled to receive the first write word line signal; and
    a third transistor coupled between the first transistor and the power supply terminal, the third transistor having a first current electrode coupled to the second current electrode of the first transistor, a control electrode coupled to receive the first read signal, and a second current electrode coupled to the power supply terminal.

16. The nonvolatile memory device of claim 15, wherein each of the plurality of memory cells comprises:
    a transistor having a control electrode coupled to a corresponding one of the decoded address signals, and having a first current electrode coupled to a write bit line; and
    a variable resistance element having a first terminal coupled to a second current electrode of the transistor and having a second terminal coupled to the shared port.

17. The nonvolatile memory device of claim 13, wherein each shared port block comprises:
    a fourth transistor having a first current electrode coupled to a write bit line, a second current electrode coupled to the first terminal of the capacitor, and a control electrode coupled to receive the write word line signal.

18. The nonvolatile memory device of claim 17, wherein each of the plurality of memory cells comprises:
    a first transistor having a control electrode coupled to a corresponding one of the plurality of decoded address signals, and having a first current electrode coupled to a write bit line;
    a variable resistance element having a first terminal coupled to a second current electrode of the transistor and having a second terminal coupled to the shared port; and
    a second transistor having a control electrode coupled to the word line signal, and having a first current electrode coupled to the second terminal of the variable resistance element, and having a second current electrode coupled to the write bit line.

19. The nonvolatile memory device of claim 13, further comprising:
   a read line coupled to the first shared port block; and
   a fifth transistor coupled between the first transistor and the power supply terminal, the fifth transistor having a first current electrode coupled to the second current electrode of the first transistor, a control electrode coupled to the read line, and a second current electrode coupled to the power supply terminal.

20. A method for performing a read operation on a nonvolatile memory device, the method comprising:
   receiving a read signal at a shared port block, the read signal operable to enable a read operation associated with the shared port block, the shared port block comprising a shared port communicatively coupled to a block, the block comprising a plurality of memory cells;
   receiving a plurality of decoded address signals at the shared port block, each of the plurality of decoded address signals operable to enable a corresponding one of the plurality of memory cells; and
   receiving a read word line signal at the shared port block, the read word line signal operable to enable the read operation, wherein the shared port comprises:
      a capacitor having a first terminal communicatively coupled to the read word line signal; and
      a first transistor having a control electrode coupled to a second terminal of the capacitor, a first current electrode coupled to a read bit line, and a second current electrode coupled to a power supply terminal.

* * * * *